US012667006B2

(12) United States Patent
Karhade et al.

(10) Patent No.: US 12,667,006 B2
(45) Date of Patent: Jun. 23, 2026

(54) INTEGRATED CIRCUIT PACKAGES WITH HYBRID BONDED DIES AND METHODS OF MANUFACTURING THE SAME

(71) Applicant: Intel Corporation, Santa Clara, CA (US)

(72) Inventors: Omkar Karhade, Chandler, AZ (US);
Nitin Deshpande, Chandler, AZ (US);
Harini Kilambi, Portland, OR (US);
Jagat Shakya, Hillsboro, OR (US);
Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 557 days.

(21) Appl. No.: 17/957,926

(22) Filed: Sep. 30, 2022

(65) Prior Publication Data

US 2024/0113088 A1     Apr. 4, 2024

(51) Int. Cl.
H01L 21/66        (2006.01)
H01L 23/31        (2006.01)
(Continued)

(52) U.S. Cl.
CPC ........... H10W 90/00 (2026.01); H10P 74/273 (2026.01); H10W 74/131 (2026.01);
(Continued)

(58) Field of Classification Search
CPC ....... H01L 25/105; H01L 23/32; H01L 21/66; H01L 23/3157
See application file for complete search history.

(56) References Cited

U.S. PATENT DOCUMENTS

2009/0065951 A1*   3/2009   Cheah ..................... H01L 25/18
                                                    257/E21.705
2009/0283888 A1*  11/2009   Choi ....................... H01L 25/03
                                                    438/109
(Continued)

OTHER PUBLICATIONS

European Patent Office, "Extended European Search Report," issued in connection with European Patent Application No. 24194239.0, dated Dec. 3, 2024, 13 pages.
(Continued)

*Primary Examiner* — Dale E Page
*Assistant Examiner* — Wilner Jean Baptiste
(74) *Attorney, Agent, or Firm* — Hanley, Flight & Zimmerman, LLC

(57)        ABSTRACT

Methods, apparatus, systems, and articles of manufacture are disclosed includes an integrated circuit (IC) package including a first die including a first surface and a second surface opposite the first surface, the first surface defined by a bulk semiconductor region of the first die, a second die including a third surface and a fourth surface opposite the third surface, the third surface defined by a bulk semiconductor region of the second die, the fourth surface facing towards the second surface, a first bonding layer between the second and fourth surfaces, the first bonding layer including first metal vias disposed therein, and a second bonding layer between the second and fourth surfaces, the second bonding layer including second metal vias disposed therein, the first bonding layer in direct contact with the second bonding layer, ones of the first metal vias in direct contact with ones of the second metal vias to electrically couple the first die to the second die.

19 Claims, 9 Drawing Sheets

(51) Int. Cl.

| | |
|---|---|
| *H01L 25/10* | (2006.01) |
| *H10P 74/00* | (2026.01) |
| *H10W 74/10* | (2026.01) |
| *H10W 90/00* | (2026.01) |
| *H10W 72/00* | (2026.01) |
| *H10W 72/90* | (2026.01) |
| *H10W 80/00* | (2026.01) |

(52) U.S. Cl.

CPC .... *H10W 72/07331* (2026.01); *H10W 72/952* (2026.01); *H10W 80/312* (2026.01); *H10W 80/327* (2026.01); *H10W 90/792* (2026.01)

(56) References Cited

U.S. PATENT DOCUMENTS

| | | | |
|---|---|---|---|
| 2012/0001306 A1* | 1/2012 | Wang | H01L 21/4839 |
| | | | 257/E21.503 |
| 2014/0376189 A1* | 12/2014 | Sakaguchi | H01L 23/49827 |
| | | | 174/252 |
| 2019/0148351 A1 | 5/2019 | Chen et al. | |
| 2020/0235073 A1 | 7/2020 | Chen et al. | |
| 2020/0411473 A1 | 12/2020 | Chen et al. | |
| 2021/0098381 A1 | 4/2021 | Yu et al. | |
| 2021/0358875 A1 | 11/2021 | Lee et al. | |
| 2023/0197551 A1* | 6/2023 | Karhade | H01L 23/3178 |
| | | | 257/622 |
| 2023/0207522 A1 | 6/2023 | Karhade et al. | |
| 2025/0105207 A1 | 3/2025 | Karhade et al. | |

OTHER PUBLICATIONS

European Patent Office, "Communication pursuant to Article 94(3) EPC," issued in connection with European Patent Application No. 24194239.0, dated Jan. 23, 2026, 13 pages.

* cited by examiner

900

214

240
241
264
902
254
208
212
258
216
220
228
202
238
206
244
232
226
904
222
234
224
236
908
260
246
262
230
204
218
256
210
248
906
252          250

1000

1002

1010
1011
1008
1004
1006
1014
1012
1016
1018
1020

INTEGRATED CIRCUIT PACKAGES WITH HYBRID BONDED DIES AND METHODS OF MANUFACTURING THE SAME

FIELD OF THE DISCLOSURE

This disclosure relates generally to electronic devices and, more particularly, to hybrid bonded dies and methods of manufacturing the same.

BACKGROUND

The rapid speed of data transmission within computation, storage and communication infrastructures is pushing the speed boundary of traditional copper-based electrical links. Additionally, with the increasing functionality of circuitry and increasing density of semiconductor devices, physically positioning a sufficient number of interconnects on an exterior surface of a die has become increasingly difficult. Die stacking allows for multi-chip package structures that enable significant performance leaps in computing capability and memory/processor integration. The multi-chip package structures, allowed by die stacking, allow for increased speed in data transmission, as die stacking allows for more interconnects on the exterior surface of the die.

Figure 1:
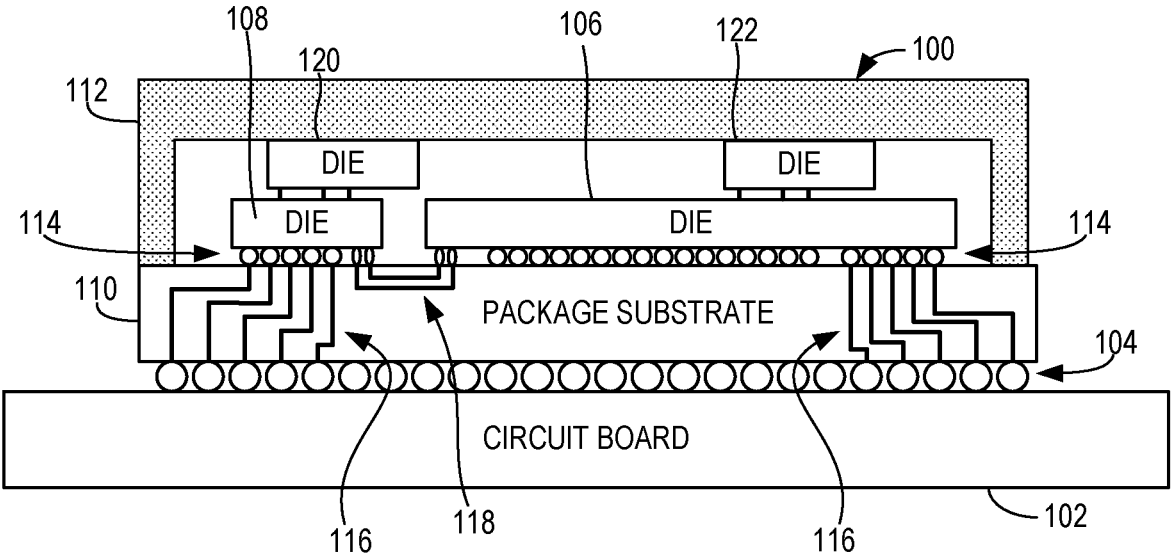
FIG. 1 illustrates an example integrated circuit (IC) package that is electrically coupled to a circuit board.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real-world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

Multi-chip package structures are to implement interconnect structures that enable efficient and effective communication between package components such as integrated circuit (IC) chips memory, network on chip (NoC) components, processing elements, etc. Advanced processing systems require high bandwidth and low power interconnects between their subsystems. Some systems can require extremely high-speed frequency links on the order of several hundred gigahertz (GHz) to a terahertz (THz) between circuitry within a die and/or between different dies of a computing system or semiconductor package. The high-speed relates to a high bandwidth. The high-bandwidth enables faster processing speeds for bandwidth intensive workloads (e.g., machine learning applications). For instance, the ability to implement high-speed communication links in package structures that are capable of transmitting data rates in the range of Gbps (Gigabits per second) to hundreds of Gbps are advantageous for various types of systems (e.g., radar, imaging, computer server systems, etc.) designed to operate at millimeter-wave frequencies (e.g., between 30 gigahertz (GHz) and 300 gigahertz (GHz)) or higher speed signals having Terahertz frequencies.

Hybrid bonding manufacturing techniques enable different components or layers of a semiconductor package to be manufactured separately and then joined to form a near-monolithic substrate package. As used herein, monolithic semiconductor package is defined as a semiconductor package formed from a unitary or single wafer. A near-monolithic semiconductor package as used herein is defined to mean that individual components (e.g., the semiconductor dies, interposers, etc.) can be manufactured separately, but the semiconductor package appears to be monolithic when the separate components are coupled or bonded together (e.g., via hybrid bonding) in a single semiconductor package.

Figure 2:
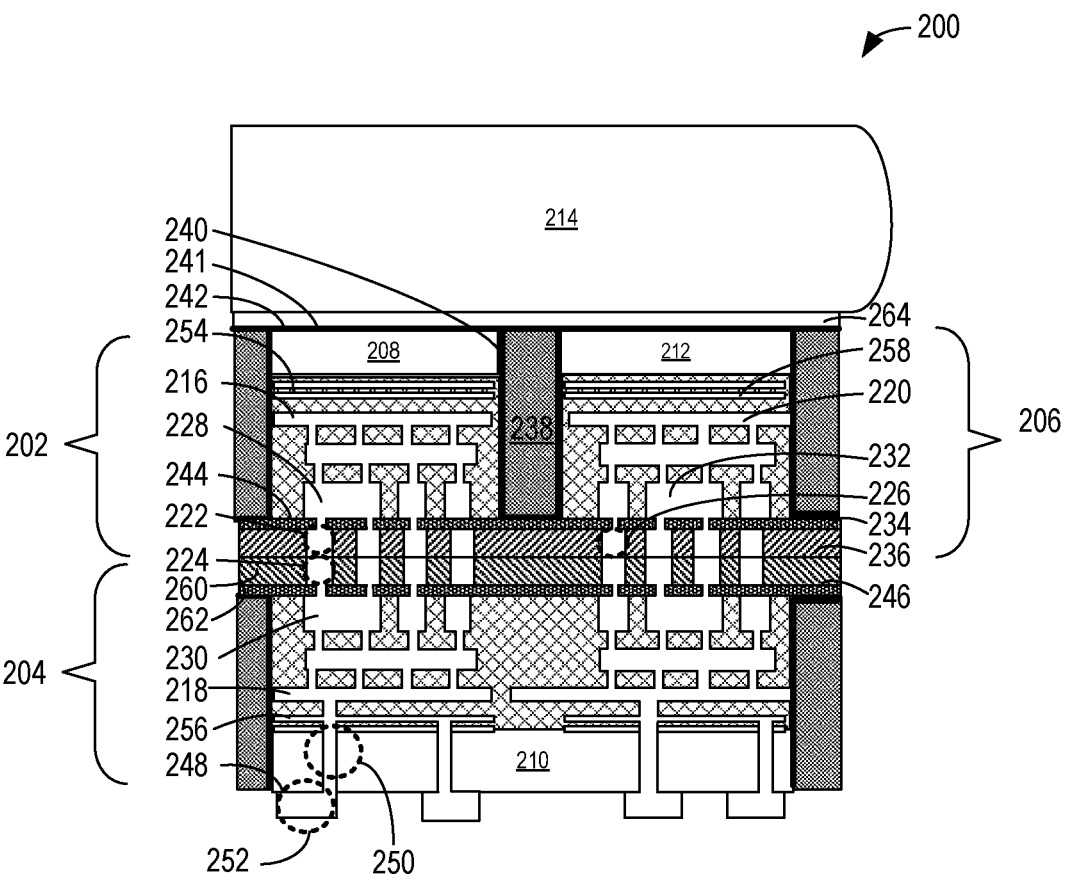
FIG. 2 illustrates an example semiconductor package.

FIG. 1 illustrates an example integrated circuit (IC) package 100 that is electrically coupled to a circuit board 102. In some examples, the IC package 100 is electrically coupled to the circuit board 102 by first electrical connections 104. The first electrical connections 104 may include pins, pads, bumps, and/or balls to enable the electrical coupling of the IC package 100 to the circuit board 102. In this example, the IC package 100 includes two semiconductor dies 106, 108 (e.g., two silicon dies) that are mounted to a package substrate 110 and enclosed by a package lid or mold compound 112. The IC package 100 includes a third semiconductor die 120 that is bonded (e.g., adjacent, attached, connected) above the first semiconductor die 106 and a fourth semiconductor die 122 that is bonded (e.g., adjacent, attached, connected) above the second semiconductor die 108. While the example IC package 100 of FIG. 1 includes four dies 106, 108, 120, 122 in other examples, the IC package 100 may have only one die or more than four dies. FIG. 1 is a generic package that illustrates dies that can be stacked (e.g., hybrid bonded). An example implementation of die stacking of FIG. 1 is illustrated in FIG. 2.

As shown in the example of FIG. 1, each of the dies 106, 108 is electrically and mechanically coupled to the package substrate 110 via second electrical connections 114. The second electrical connections 114 may include pins, pads, balls, and/or bumps. The second electrical connections 114 between the dies 106, 108 and the package substrate 110 are sometimes referred to as first level interconnects. By contrast, the first electrical connections 104 between the IC package 100 and the circuit board 102 are sometimes referred to as second level interconnects. In some examples, one or both of the dies 106, 108 may be stacked on top of one or more other dies and/or an interposer such as the third die 120. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer.

As shown in the illustrated example, the package substrate 110 includes first electrical traces and/or routing 116 that electrically connects the first electrical connections 104 with the second electrical connections 114, thereby enabling the electrical coupling of the first and/or second dies 106, 108 with the circuit board 102. Further, in some examples, the package substrate 110 includes second electrical traces and/or routing 118 that electrically connect different ones of the first electrical connections 104 associated with the first and second dies 106, 108, thereby enabling the electrical coupling of the first and second dies 106, 108. FIG. 1 is a generic semiconductor package that illustrates the second die 108 and the third die 120 being stacked. An example stacking of the dies that could be implemented in FIG. 1 is illustrated in FIG. 2.

As used herein, a "known good die" is a die that has been singulated (e.g., chopped, cut into smaller wafers), and after singulation into wafers, the wafers are reconstituted to form a reconstituted die. The reconstituted die is then tested to determine if the die is ready for use in an electrical circuit (e.g., the IC package 100 of FIG. 1). Dies that pass the testing are referred herein as "known good dies." The testing of the dies occurs using a testing pad which is a region of the die to is adjacent to an electrical source.

FIG. 2 is a cross-sectional view of an example semiconductor package 200. The semiconductor package 200 of FIG. 2 may be manufactured according to an example manufacturing process illustrated in stages in FIGS. 3-9. The semiconductor package 200, with the example of FIG. 2, includes, at least, an example first die 202, an example second die 204, an example third die 206, an example first bulk semiconductor region 208, an example second bulk semiconductor region 210 (e.g., a base), an example third bulk semiconductor region 212, and an example silicon lid 214. The semiconductor package 200 also includes example first metal interconnects 216, example second metal interconnects 218, example third metal interconnects 220, example first metal vias 222, example second metal vias 224, and example third metal vias 226. The semiconductor package 200 also includes an example first testing pad region 228, an example second testing pad region 230, and an example third testing pad region 232, an example first via layer 234, an example first bonding layer 236, an example dielectric fill 238, an example adhesion layer 240 and an example second adhesion layer 241. The semiconductor package 200 also includes an example first surface 242, an example second surface 244, an example third surface 246, and an example fourth surface 248. The semiconductor package 200 also includes an example through-silicon-via 250 (TSV), example bumps 252, example first transistors 254, example second transistors 256, example third transistors 258, an example second bonding layer 260, an example second via layer 262 and an example fusion bonding dielectric layer 264. The components of FIG. 2 will be mentioned in detail when the components are introduced in the manufacturing process as described in connection the examples of with FIGS. 3-9.

The first die 202 and the second die 204 are, for example, hybrid-bonded and stacked. As used herein, a hybrid bond is a metal-to-metal bond (e.g., copper to copper) that includes a dielectric layer between the first metal and the second metal. In some examples, the dielectric layer is an oxide layer, a nitride layer, or any other suitable dielectric. For example, a first surface (e.g., first side) of a first metal portion may be in contact with a first surface (e.g., first side) of an oxide layer, while a second surface (e.g., second side) of a second metal is in contact with the second side of the dielectric layer. Between the first die 202 and the second die 204 is a first bonding layer 236 and a second bonding layer 260. In some examples, the first bonding layer 236 and the second bonding layer 260 are in direct contact. In some examples, the first via layer 234 is between the first die 202 and the first bonding layer 236, and the second via layer 262 is between the second die 204 and the second bonding layer 260. In some examples, the dielectric fill 238 is disposed between the first die 202 and the third die 206. In some examples, the dielectric fill 238 is oxide, nitride, or any other suitable dielectric. In some examples, the first die 202 is vertically stacked adjacent the second die 204. In some examples, there are multiple dies similar to the first die 202 that are also vertically stacked (e.g., ones of the first dies 202 are stacked vertically adjacent to ones of the second dies 204).

The first die 202 includes the first transistors 254, first metal interconnects 216, and the first testing pad region 228. The second die 204 includes the second transistors 256, second metal interconnects 218, and a second testing pad region 230. Disposed in the second bulk semiconductor region 210 of the second die 204 are the through-silicon-vias 250. Disposed outside the second bulk semiconductor region 210 of the second die 204 are bumps 252 (e.g., solder balls).

The third die 206 includes the third transistors 258, a third metal interconnects 220, a third testing pad region 232, and a third bulk semiconductor region 212.

Figure 3:
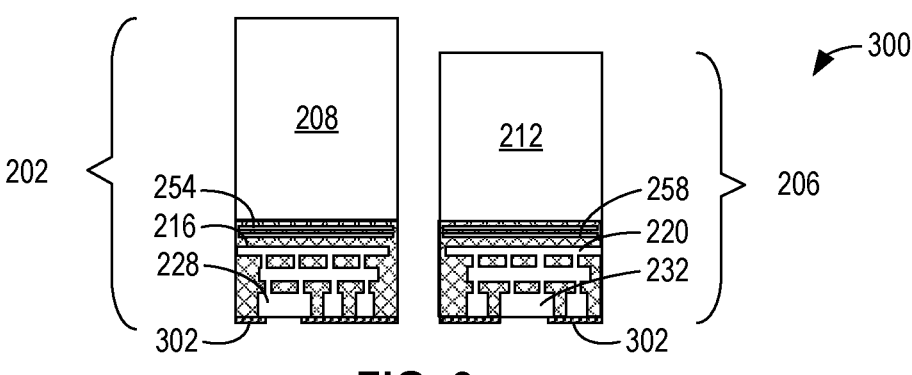
FIGS. 3-9 illustrate various stages in an example process of fabrication of the example semiconductor package of FIG. 2.

FIGS. 3-9 illustrate various stages in an example process of fabrication of the example semiconductor package 200 of FIG. 2. FIG. 3 represents a first stage 300 of the example fabrication process to generate the semiconductor package 200 of FIG. 2. At the beginning of FIG. 3, the first die 202 and the third die 206 are provided (e.g., the second die 204 will be introduced in connection with FIG. 6). The first bulk semiconductor region 208 and the third bulk semiconductor region 212 have not yet been planarized. In some examples, the bulk semiconductor regions 208, 212 are silicon. The first bulk semiconductor region 208 is connected (e.g., electrically coupled, attached) to the first transistors 254. The first transistors 254 are to connect the first bulk semiconductor region 208 to the first testing pad region 228. In some examples, the first testing pad region 228 is dimensioned at approximately 30-100 micrometers (μm). In some examples, the testing pad regions 228, 230, 232 include a first testable pad (e.g., the pad region 228) and a second testable pad (e.g., the pad regions 230, 232). For example, the first testable pad may be approximately between 40-110 micrometers (μm) in diameter and have an opening that may be approximately 30-100 micrometers (μm) in diameter in the layer 302. For example, the second testable pad may be a square or rectangle pads that is between approximately 3-7 micrometers (μm). The first testing pad region 228 includes first metal interconnects 216 disposed throughout the first testing pad region 228 from the first transistors 254 to an example fusion bonding dielectric layer 302

The third die 206 is similar to the first die 202. The third die 206 includes the third bulk semiconductor region 212, third transistors 258, and third metal interconnects 220 and the third testing pad region 232, similar to how the first die 202 includes the first bulk semiconductor region 208, the first transistors 254, the first metal interconnects 216, and the first testing pad region 228.

In FIG. 3, the first die 202 and the third die 206 are tested with the first testing pad region 228 and the third testing pad region 232. As used herein, a reconstituted die is a die made from singulated (e.g., chopped) wafers. The dies are combined to generate a reconstituted wafer. The testing process, performed in the first testing pad region 228 and the third testing pad region 232, determines which dies are good so only good dies can be selectively reconstituted. Tested pads can be detected by a probe mark on top of the pad (e.g., a top surface of the first testing pad region 228). The manufacturing process continues to FIG. 4.

Figure 4:
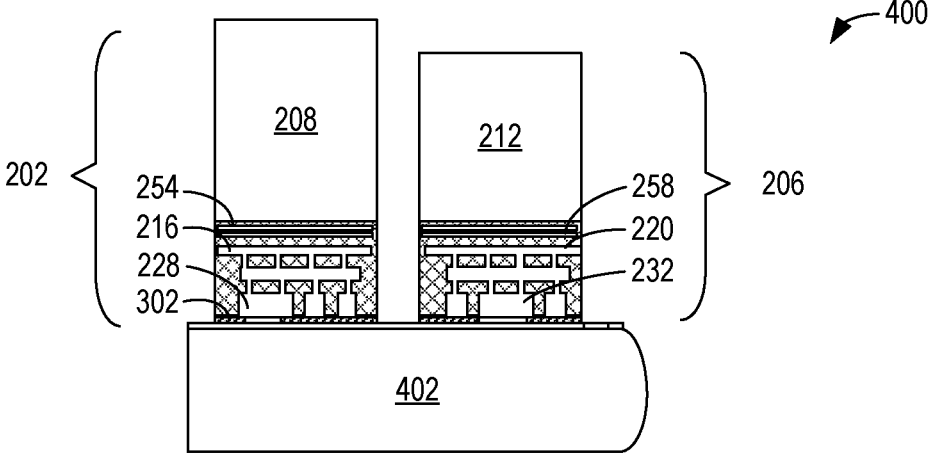

At the second stage 400 as shown in FIG. 4, the carrier wafer 402 is fusion-bonded to a second surface of the first die 202 and a second surface of the third die 206 (e.g., the dies 202, 206 are bonded to the carrier wafer 402). As used herein, a fusion-bond is to connect (e.g., attach, fuse, link) at least two surfaces together without an oxide layer between the two surfaces. The carrier wafer 402 may be silicon-oxide (SiO), silicon nitride (SiN), or silicon carbon nitride (SiCN). In some examples, a fusion bond occurs at temperatures such as two hundred degrees Fahrenheit.

The fusion bonding dielectric layer 302 is to connect the first die 202 and the third die 206, however an individual misalignment may be detected for the first die 202 and the third die 206. The fusion bonding dielectric layer 302 (e.g., copper alignment) is used in FIG. 4 to align the first die 202 and the third die 206 with an example carrier wafer 402 of FIG. 4. In some examples, a first misalignment may occur based on a shift between the fusion bonding dielectric layer 302 and the first die 202, while a second misalignment for the third die 206 may occur, where the first misalignment is different from the second misalignment.

Figure 5:
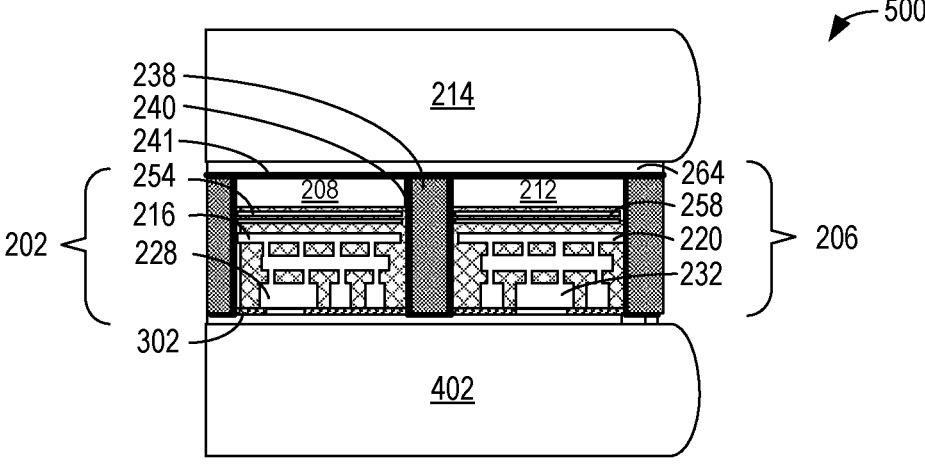

The third stage 500 shown in FIG. 5 includes three sub-stages: planarization, dielectric filling, and lid attachment. The planarization process occurs to thin (e.g., remove excess material from) the first bulk semiconductor region 208 of the first die 202 and the third bulk semiconductor region 212 of the third die 206. The planarization process may be performed by a chemical mechanical polishing (CMP) process.

In some examples, after the planarization process, the dielectric fill 238 is deposited in between the first die 202 and the third die 206. In some examples, an adhesion layer 240 is deposited onto the edges of the first die 202 and the third die 206 before the dielectric fill 238 is deposited. The adhesion layer 240 attaches to the edges of the first die 202 and the third die 206 and provides a surface for the dielectric fill 238 to attach. In some examples, the adhesion layer 240 is also added on the first (top) surface 242 of the first die 202 and the third die 206 prior to the depositing of the dielectric fill 238. In some examples, the planarization process is performed after the deposition of the adhesion layer 240 and the dielectric fill 238 such that the adhesion layer 240 on the top surface 242 of the dies 208, 212 and at least some of the dielectric fill 238 is removed during the planarization process. In some examples, a second adhesion layer 241 is deposited after the dielectric fill 238 is deposited (and planarized) to cover the top surface 242 of the dies and the exposed surface of the dielectric fill 238. The second adhesion layer 241 is to connect the top portion of the dielectric fill 238 and the dies 208, 212 to the lid 214. In some examples, the second adhesion layer 241 is the same material as the first adhesion layer 240. In other examples, the second adhesion layer 241 is different than the first adhesion layer 240.

After the dielectric fill 238 is deposited, the silicon lid 214 is attached to the first surface (e.g., a top surface) of the first die 202 and the first surface (e.g., a top surface) of the third die 206. The silicon lid 214 is connected (e.g., adjacent, in contact) to the first die 202 and the third die 206. As defined herein, adjacent refers to direct contact or in close proximity but with intermediate layers or items between. In some examples, the silicon lid 214 may be fusion-bonded to the first surface 242 of the first die 202 and the first surface 242 of the third die 206. In some examples, a fusion bonding dielectric layer 264 is between the silicon lid 214 and the first surface of the first die 202 and the first surface of the third die 206. For example, fusion bonding involves both the surfaces (e.g., a surface of the silicon lid 214, a first surface of the dies 202, 206) having a dielectric layer before bonding. In such examples, the fusion bonding dielectric layer 264 may include at least two layers (e.g., the second adhesion layer 241 on the first surfaces of the dies 208, 212 and a separate adhesion (dielectric layer) on the surface of the lid 214). In some examples, the silicon lid 214 is fusion-bonded to a first planarized edge of the first bulk semiconductor region 208 of the first die 202 and to a first planarized edge of the third bulk semiconductor region 212 of the third die 206. The silicon lid 214 provides mechanical stability for the first die 202 and the third die 206. The carrier wafer 402 provides stability for the first die 202 and the third die 206, so that the silicon lid 214 may be attached. As described below, after the carrier wafer 402 is removed, the silicon lid 214 may remain attached to the first die 202 and the third die 206 to provide stability for the first die 202 and the third die 206.

Figure 6:
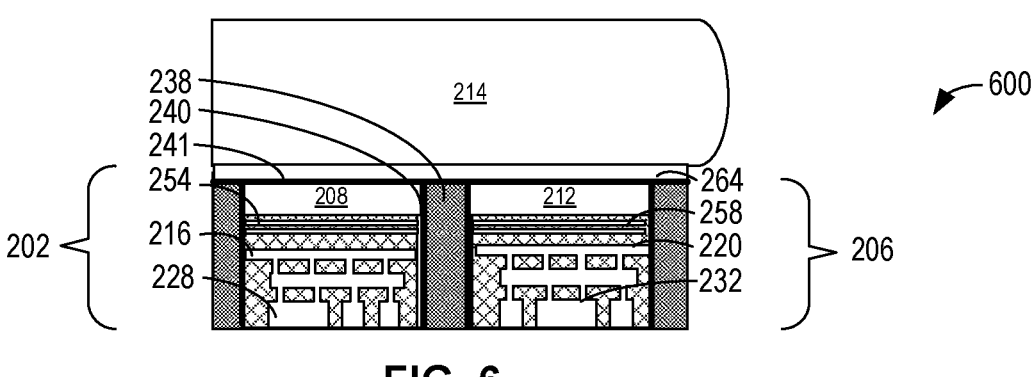
Figure 7:
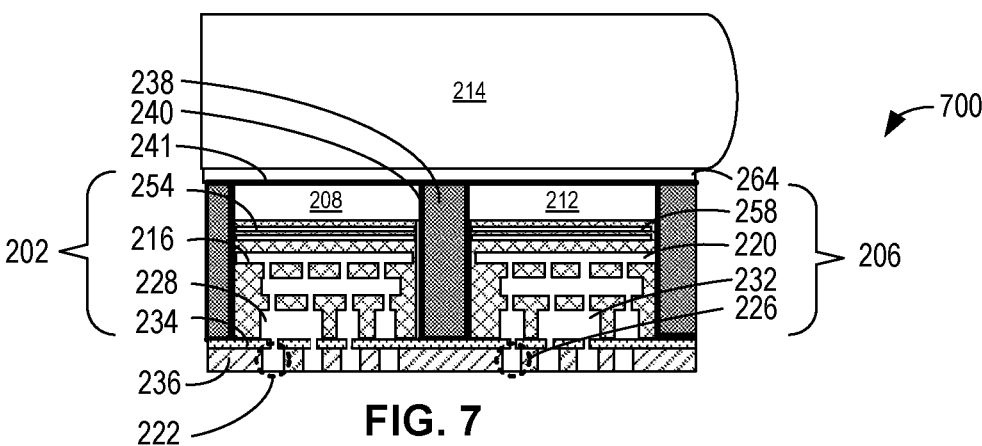

At the fourth stage 600 of FIG. 6, the carrier wafer 402 is removed. In some examples, the carrier wafer 402 was fusion-bonded to the second (e.g., bottom, lower) edge of the first die 202 and the third die 206. In some examples, the carrier wafer 402 is removed by a planarization process, silicon etching process, or a grinding process. After the carrier wafer 402 is removed, the first metal interconnects 216, the first testing pad region 228, the third metal interconnects 220, and the third testing pad region 232 are exposed. By exposing the first metal interconnects 216, the first testing pad region 228, the third metal interconnects 220, and the third testing pad region 232, the method is to allow for a first via layer 234 and a first bonding layer 236 to be deposited in the next stage as illustrated in FIG. 7. The planarization process also removes the fusion bonding dielectric layer 302 (FIG. 3).

At the fifth stage 700 of FIG. 7, the method is to deposit the via layer 234 and the first bonding layer 236. In some examples, the via layer 234 is deposited before the first bonding layer 236. In some examples, such as the example of FIG. 10, the via layer 234 is not included. The via layer 234 is to protect the first metal vias 222 (e.g., electrical trace, electrical routing, conductive routing, etc.) and the third metal vias 226, which are plated later in the manufacturing sub-stage of the fifth stage 700 of FIG. 7. After the via layer 234 is deposited as an interlayer dielectric (ILD), there is lithography of the via layer 234 to generate openings (e.g., holes) for the metal vias 222, 226. After the lithography process, a plating process deposits the metal (e.g., copper) into the openings and extend the metal vias 222, 226 through the via layer 234. Then the metal vias 222, 226 and the via layer 234 undergo a first planarization process (e.g., chemical mechanical polishing (CMP)), which polishes the metal vias 222, 226 and the via layer 234 to a smooth surface. In some examples, the metal vias 222, 226 are planarized before the via layer 234 was deposited.

After the via layer 234 and the metal vias 222, 226 disposed inside the via layer 234 are planarized, the first bonding layer 236 is deposited as an interlayer dielectric. After the first bonding layer 236 is deposited, a lithography process is used to cut openings (e.g., holes) in the first bonding layer 236 for the metal vias 222, 226. After the lithography has generated bonding layer holes (e.g., openings) for the metal vias 222, 226, the metal vias 222, 226 are plated (e.g., extended) through the bonding layer holes in the first bonding layer 236. Then the metal vias 222, 226 and the first bonding layer 236 undergo a second planarization process (e.g., chemical mechanical polishing (CMP)) to generate a smooth surface.

Figure 8:
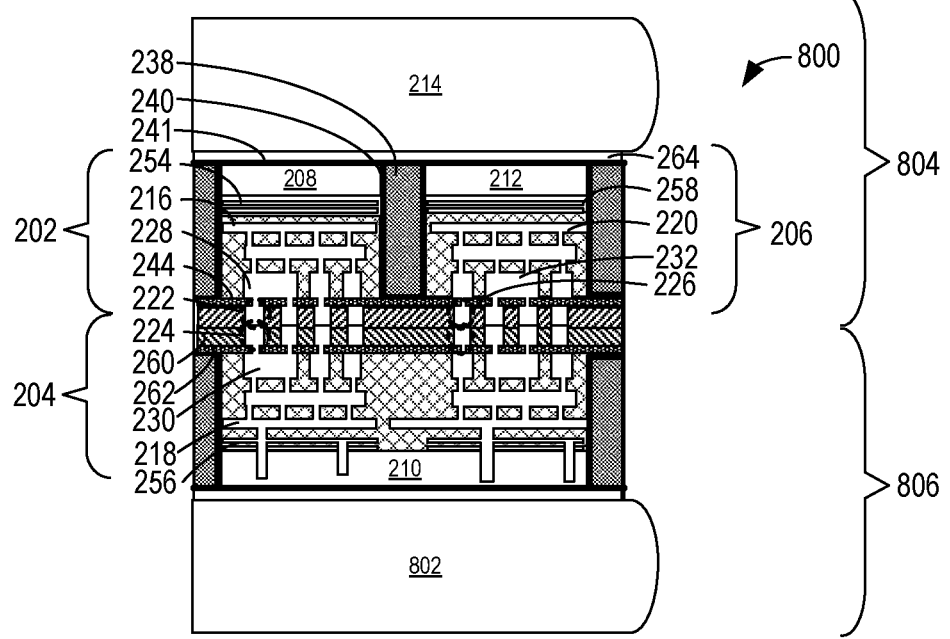

The fifth stage 700 of FIG. 7 may generate other portions of the semiconductor package 200 (e.g., a first portion 804 of the semiconductor package 200, a second portion 806 of the semiconductor package 200). For example, a first portion 804 (e.g., top portion) of the semiconductor package 200 corresponding to FIG. 2 is illustrated in FIG. 7 and FIG. 8. In addition, the method described in connection with FIG. 7 may generate a second portion 806 (e.g., bottom portion) of the semiconductor package 200 corresponding to FIG. 2 that while not illustrated in FIG. 7, is illustrated in FIG. 8. The second portion 806 of the semiconductor package 200 does not include a silicon lid 214 but is instead fusion-bonded to an example carrier wafer 802. The second portion 806 includes second metal vias 224 that are to fasten (e.g., attach, connect, adjacent) to a bottom edge of the top portion 804 of the semiconductor package 200. In some examples, the second carrier wafer 802 may be a reconstituted carrier wafer or may be a non-reconstituted carrier wafer.

The sixth stage 800 of FIG. 8 then combines the two portions 804, 806 of the semiconductor package 200. The first portion 804 is the portion generated at the end of the fourth stage 600 of FIG. 6. The second portion 806, which was previously fabricated, includes the second bulk semiconductor region 210 (e.g., a base), second transistors 256, second testing pads 230, second metal vias 224, a second via layer 262, and a second bonding layer 260. The second portion 806 is fusion bonded to the second carrier wafer 802. In some examples, fusion bonding occurs at approximately two hundred degrees Fahrenheit. The first bonding layer 236 of the first portion is hybrid bonded to the second bonding layer 260. As used herein, a hybrid bond is a bond that joins the metal of the first metal vias 222 and the second metal vias 224 such that the first metal vias 222 and the second metal vias 224 are adjacent. The first metal vias 222 of the first portion are adjacent (e.g., in electrical connection, in physical connection) with the second metal vias 224 in the second portion. In some examples, the second die 204 is covered by the second bonding layer 260, with the second metal vias 224 extending through the second bonding layer 260.

Figure 9:
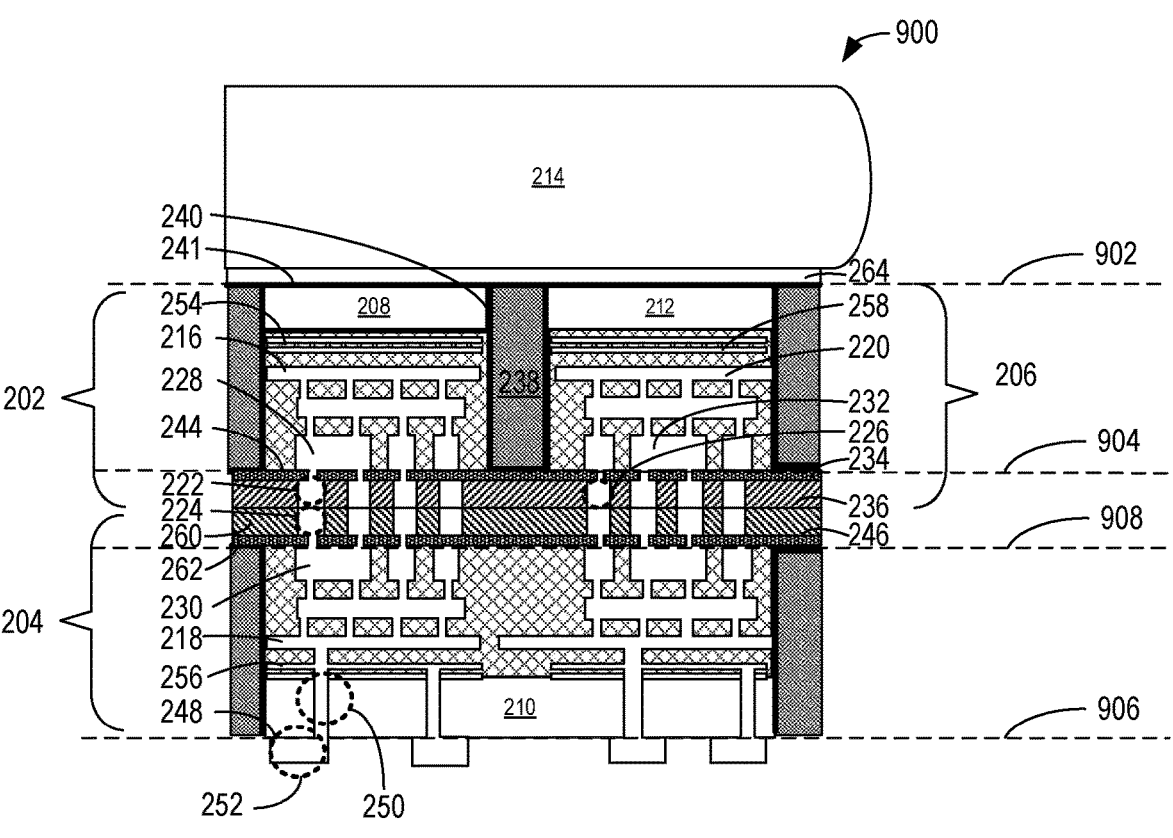

At the seventh stage 900 of FIG. 9, the second carrier wafer 802 is removed from the second portion of the semiconductor package 200. The second portion of the semiconductor package 200 defines the second die 204. In some examples, the second carrier wafer 802 is removed based on an etching process similar to the etching process to remove the first carrier wafer 402 in FIG. 6. After the second carrier wafer 802 is removed, the second metal vias 224 are extended to form example through-silicon-vias (TSV) 250 that cut through the second bulk semiconductor region 210 (e.g., a base). Then bumps 252 (e.g., solder balls) are added (e.g., attached) to the TSVs 250. The bumps 252 may connect the semiconductor package 200 to other parts of sockets or microprocessors.

FIG. 9 is the hybrid-bonded semiconductor package. FIG. 9 includes, at least, the first die 202, the second die 204, the first bonding layer 236, and the second bonding layer 260. The first die 202 includes a first surface 902 (e.g., illustrated by the dashed line in FIG. 9) and a second surface 904 (e.g., illustrated by the dashed line opposite the first surface 902). The first surface 902 is defined by the bulk semiconductor region 208 of the first die 202. The second die 204 (e.g., the base) includes a third surface 906 and a fourth surface 908 opposite the third surface 906. The third surface 906 is defined by the second bulk semiconductor region 210 (e.g., a base). The fourth surface 908 facing towards the second surface 904. The first bonding layer 236 between the second and fourth surfaces 904, 908. The first bonding layer 236 includes first metal vias 222 disposed therein. The second bonding layer 260 between the second and fourth surfaces 904, 908, the second bonding layer 260 including second metal vias 224 disposed therein. The first bonding layer 236 is in direct contact with the second bonding layer 260. Ones of the first metal vias 222 are in direct contact with ones of the second metal vias 224 to electrically couple the first die 202 to the second die 204. The first transistors 254 disposed in the first die 202 are facing away (e.g., are distal) from second transistors 256 disposed in the second die 204. In the example of FIG. 9, ones of the first metal vias 222 are to electrically contact ones of the of exposed portions of metal contacts (e.g., the first metal interconnects 216 of FIG. 9).

Figure 10:
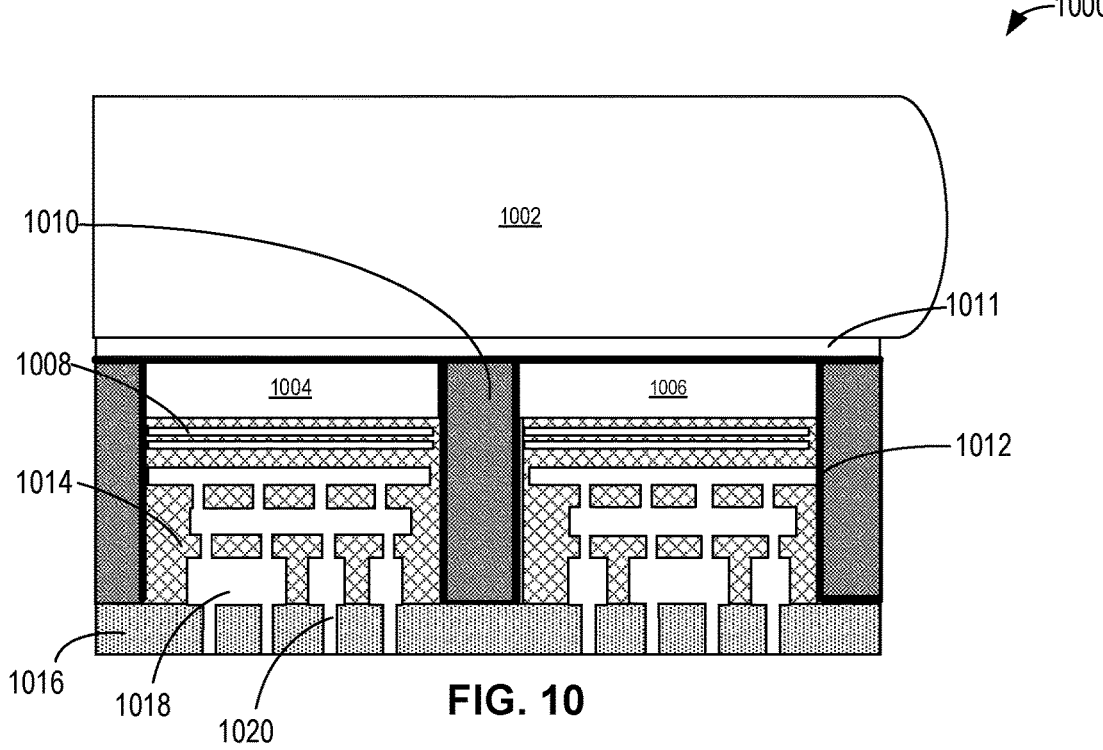
FIG. 10 illustrates an example first alternate semiconductor package.

FIG. 10 is an alternative semiconductor first portion 1000. The techniques to manufacture the semiconductor first portion 1000 that is a first alternative to the semiconductor first portion 804 of FIG. 8 follow the stages relating to FIGS. 3-6. The semiconductor first portion 1000, at this stage, includes an example silicon lid 1002, an example first bulk semiconductor region 1004, an example second bulk semiconductor region 1006, example first transistors 1008, example dielectric fill 1010, example oxide barrier layer 1012, an example testing pad region 1014 and example metal interconnects 1018. In some examples, the semiconductor first portion 1000 includes an example layer 1011 that is between the silicon lid 1002 and the first surface of the first bulk semiconductor region 1004 and the first surface of the second bulk semiconductor region 1006. After the first carrier wafer 402 is removed in FIG. 6, FIG. 10 deposits a bonding layer 1016, instead of first depositing a via layer 234 (FIG. 7) and then depositing a first bonding layer 236 (FIG. 7). After the bonding layer 1016 is deposited in FIG. 10, there is a lithography process to cut openings in the bonding layer 1016. A plating process extends the metal interconnects 1018 through the first bonding layer 236 as example metal vias 1020. Then a planarization process (e.g., chemical mechanical polishing (CMP)) is to smooth the bonding layer 1016 and the metal vias 1020. The semiconductor first portion 1000 may be combined with a second semiconductor portion (e.g., the second semiconductor portion illustrated in FIG. 8). An advantage of the semiconductor first portion 1000 (e.g., a semiconductor portion that does not using the via layer 234 of FIG. 7) is a cost reduction as the semiconductor portion does not include the material and process for the via layer 234 of FIG. 7.

Figure 11:
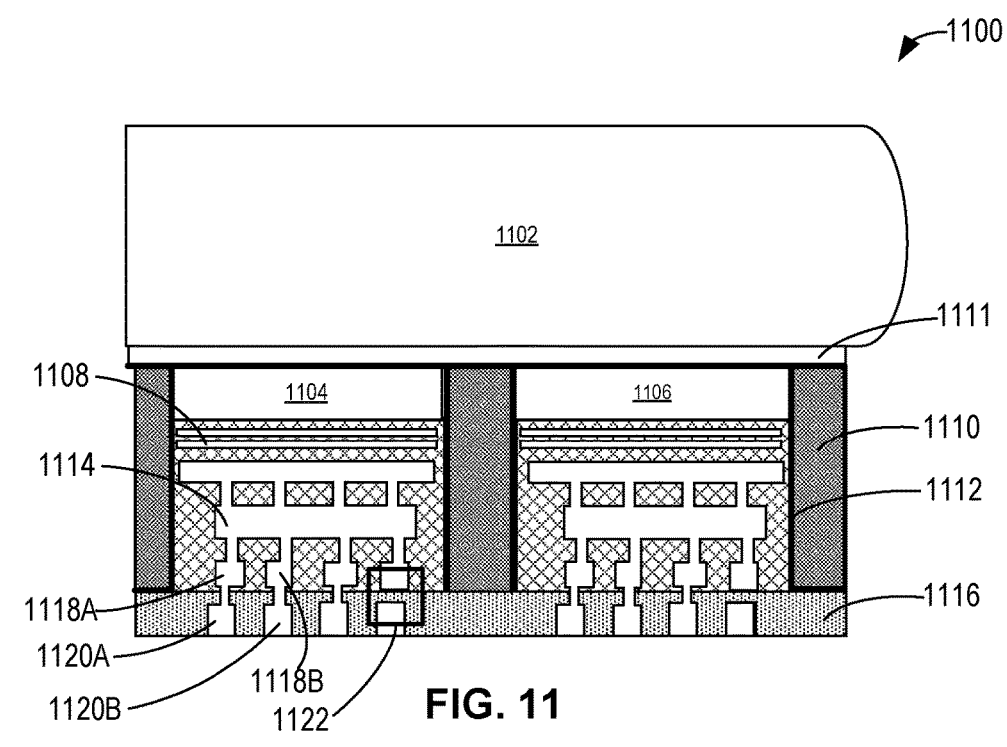
FIG. 11 illustrates an example second alternate semiconductor package.

FIG. 11 is a second alternative semiconductor first portion 1100. The techniques to manufacture the semiconductor first portion 1100 that is a second alternative to the semiconductor first portion 804 of FIG. 8 follow the stages relating to FIGS. 3-6. The semiconductor first portion 1100, at this stage, includes an example silicon lid 1102, an example first bulk semiconductor region 1104, an example second bulk semiconductor region 1106, example first transistors 1108, example dielectric fill 1110, example oxide barrier layer 1112 and an example testing pad region 1114. In some examples, the semiconductor first portion 1100 includes an example layer 1111 that is between the silicon lid 1102 and the first surface of the first bulk semiconductor region 1104 and the first surface of the second bulk semiconductor region 1106. FIG. 11 differs from FIG. 10 as FIG. 11 includes example first metal interconnects 1118a and second metal interconnects 1118b, while in FIG. 10, the metal interconnects 1018 (FIG. 10) are in one portion. The first metal interconnects 1118a and second metal interconnects 1118b are in two portions. After the bonding layer 1116 is deposited, a lithography process is to generate openings in the bonding layer 1116. Then a plating process is to extend the first metal interconnects 1118a and the second metal interconnects 1118b to generate first metal vias 1120a and second metal interconnects 1120b, respectively. However, some of the metal vias do not extend to the vias 1120. In FIG. 11, like FIG. 11, there is an example gap 1122 where ones of the metal interconnects 1118 are not in electrical connection with ones of the metal vias 1120a,b. In some examples, the first metal interconnects 1118a and the second metal interconnects 1118b are isolated from the metal vias 1120 (e.g., the metal vias 1120a,b are electrically isolated from the metal interconnects 1118 as a dummy pad layer). The semiconductor first portion 1100 is an embodiment with a dummy pad layer that comes from a reconstituted die and the via layer and the bond pad layer are formed post reconstitution. An advantage of the semiconductor first portion 1100 (e.g., a semiconductor portion that includes a dummy pad layer) is that the architecture does not require special design requirements for the testing pad region 1114. That is, unlike in the illustrated example of FIG. 7 in which the testing pads 228, 230, 232 need to be large enough to accommodate any errors from die placement, no such limitation is placed on the testing pad region 114.

Figure 12:
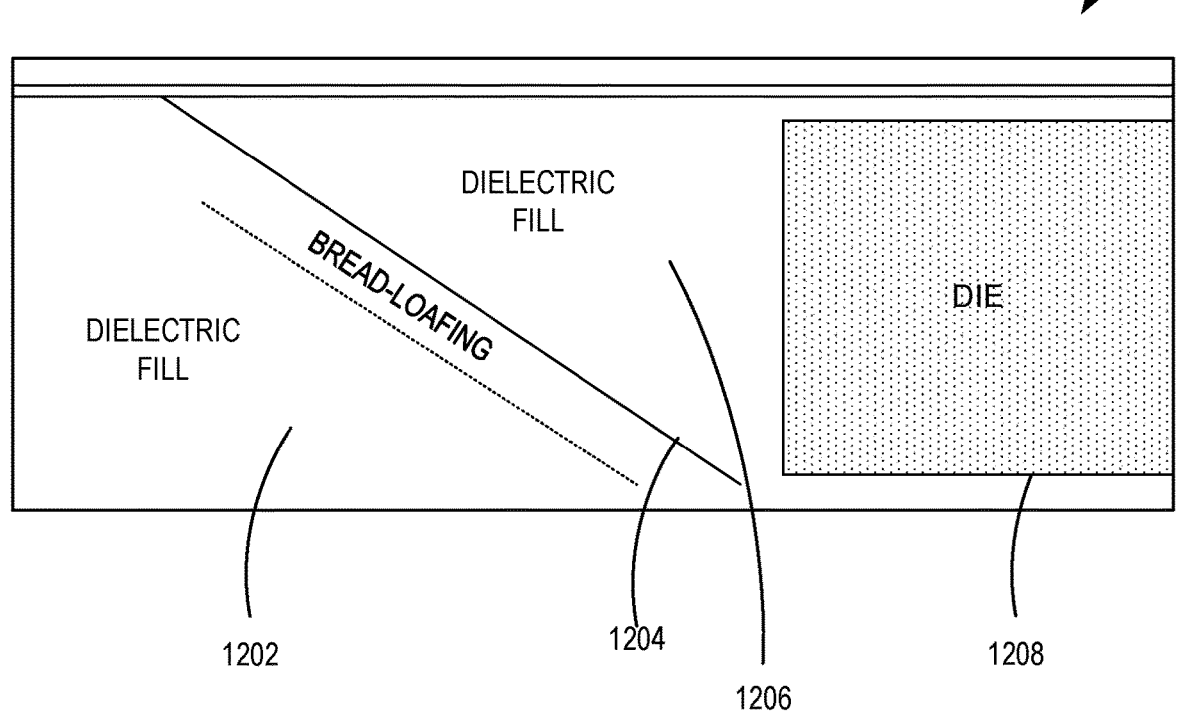
FIG. 12 is a scanning electron microscope image an example bread-loafing line that is visible due to the manufacturing process of the example semiconductor package of FIG. 2.

FIG. 12 is an illustration 1200 of example visible bread-loafing lines. The dielectric fill 238 (FIG. 5) is deposited from the first bonding layer 236 (FIG. 2) upwards, which allows the bread-loafing lines to be seen by visual inspection of cross section. In FIG. 12, a first dielectric fill 1202 is separated from a second dielectric fill 1206 by a bread-loafing line 1204. The second dielectric fill 1206 is adjacent to the example die 1208. The bread-loafing line 1204 indicates the direction of the dielectric fills 1202, 1206. The configuration of the dies 202, 206 of FIG. 8 have the bread-loafing line 1204 in a first direction, while configuration of the die 204 of FIG. 8 has the bread-loafing line 1204 in a second direction that is opposite the first direction. For example, the dielectric fills 1202, 1206 include a bread-loafing line 1204. The bread-loafing line 1204 is closer to a lateral side of the die 1208 that is adjacent to the second surface than the bread-loading line 1204 is to the lateral side of the die 1208 that is adjacent to the first surface.

Figure 13:
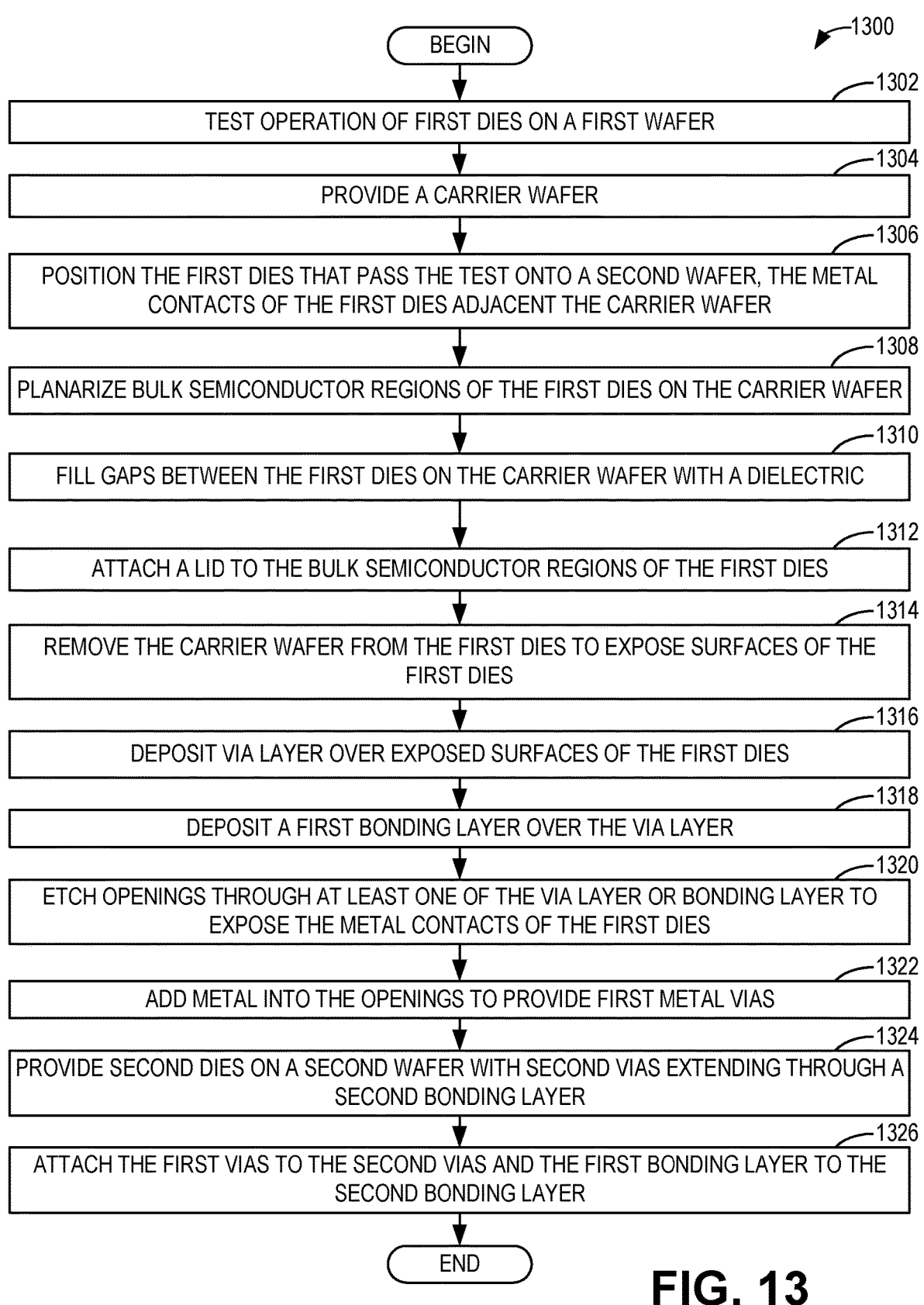
FIG. 13 is a flowchart representative of an example method of manufacturing the example semiconductor package of FIG. 2 in accordance with example techniques described in connection with FIGS. 3-9 and the first alternate semiconductor package of FIG. 10 and the second alternate semiconductor package of FIG. 11.

FIG. 13 is a flowchart illustrating an example method of manufacturing a semiconductor package (e.g., the semiconductor package 200 of FIG. 2) as described above in connection with FIGS. 3-9. In some examples, the example method of FIG. 13 is a method of manufacturing integrated circuit packages. Although the example method of manufacture is described with reference to the flowchart illustrated in FIG. 13, many other methods may alternatively be used. For example, the order of execution of the blocks may be changed, and/or some of the blocks described may be combined, divided, re-arranged, omitted, eliminated, and/or implemented in any other way. The example process will use the reference numbers associated with FIG. 2, with some reference numbers introduced between FIGS. 3-9.

The example process 1300 begins at block 1302 by testing operation of the first testing pad region 228 of the first die 202 and the third testing pad region 232 of the third die 206. When described in connection with FIG. 13, the first die 202 and the third die 206 collectively are called the first dies 202, 206. In some examples, the first die 202 is on a first wafer. In some examples, the first wafer is the wafer that the first die 202 is placed during a reconstitution process. In some examples, the first testing pad regions 228 is approximately fifty-four micrometers in width.

At block 1304, the example process 1300 provides a carrier wafer 402 (FIG. 4). In some examples, the carrier wafer 402 may be any material that is capable of being fusion-bonded to the first die 202. Some example materials are silicon-oxide (SiO), silicon nitride (SiN), or silicon carbon nitride (SiCN).

At block 1306, the example process 1300 positions the first dies (e.g., the first die 202 and the third die 206) that pass the test onto a second wafer (e.g., the carrier wafer 402), where the first metal interconnects 216 of the first die 202 and the third metal interconnects 220 of the third die 206 are adjacent the second wafer. In some examples, the first die 202 and the third die 206 include a fusion bonding dielectric layer 302 (FIG. 3) which is to align the metal interconnects 216, 220 to the correct location on the carrier wafer 402 (e.g., second wafer). In some examples, there is a first misalignment for the first die 202 on the carrier wafer 402 which is different than a second misalignment for the third die 206 on the carrier wafer. For example, the first die 202 has a first target location marked on the carrier wafer 402, while the third die 206 has a second target location marked on the carrier wafer 402. When placing the first and third dies 202, 206 on the corresponding first and third target locations, there may be different placement errors due to inherent limitations of the placement tools (e.g., on the order of less than 1 micrometer (μm)). The tool placement errors are random, such that the dies 202, 206 may each have a different error in placement.

At block 1308, the example process 1300 planarizes the bulk semiconductor regions 208, 212 of the first dies 202, 206 on the carrier wafer 402. For example, a planarization process such as chemical mechanical polishing (CMP)) may smooth the height of the first bulk semiconductor region 208 to a substantially similar height of the third bulk semiconductor region 212.

At block 1310, the example process 1300 fills gaps between the first dies 202, 206 on the carrier wafer 402 with a dielectric. In some examples, the dielectric is a dielectric fill 238 of FIG. 2. In some examples, an adhesion layer 240 is deposited on the edges of the first dies 202, 206 before the dielectric fill 238 is to fill the gaps between the first dies 202, 206.

At block 1312, the example process 1300 attaches a lid to the bulk semiconductor regions 208, 212 of the first dies 202, 206. In some examples, the lid is the silicon lid 214. In some examples, the lid may be fabricated from other inorganic materials such as silicon carbide or glass. In other examples, the lid may be fabricated from metal. In yet other examples, the lid may be fabricated from other organic materials such as an epoxy mold.

At block 1314, the example process 1300 removes the carrier wafer 402 from the first dies 202, 206 to expose surfaces of the first dies 202, 206. In some examples, the carrier wafer 402 is removed by an etching process or a grinding process. The fusion bonding dielectric layer 302 is also removed when the carrier wafer 402 is removed. The exposed surface of the first dies 202, 206 includes the testing pad regions 228, 232 and the metal interconnects 216, 220.

At block 1316, the example process 1300 deposits the via layer 234 over the exposed surfaces of the first dies 202, 206. In some examples, the via layer 234 is to protect the metal vias 222, 226 which are formed at in connection with block 1320 and block 1322. The via layer 234 is deposited as an interlayer dielectric (ILD).

At block 1318, the example process 1300 deposits the first bonding layer 236 over the via layer 234. In some examples, the first bonding layer 236 is deposited as an interlayer dielectric (ILD).

At block 1320, the example process 1300 etches openings (e.g., gaps, holes) through at least one of the via layer 234 or the first bonding layer 236.

At block 1322, the example process 1300 uses the etchings (e.g., manufactured holes), to add metal into the openings to provide first metal vias 222, 226. The metal vias 222, 226 are adjacent (e.g., in electrical connection, physical connection) with the metal interconnects 216, 220.

At block 1324, the example process 1300 provides second dies (e.g., the second die 204 of FIG. 8, however more dies may exist in reality) on a third wafer (e.g., the second carrier wafer 802). The second die 204 includes second metal vias 224 which extend through a second bonding layer 260. The second die 204 may be manufactured in a similar process to blocks 1302-1320 of FIG. 13. In some examples, the second carrier wafer 802 may be a reconstituted carrier wafer or may be a non-reconstituted carrier wafer.

At block 1326, the example process 1300 attaches the first metal vias 222 and the third metal vias 226 to the second metal vias 224. The example process 1300 also attaches the first bonding layer 236 to the second bonding layer 260. In some examples, the first bonding layer 236 and the second bonding layer 260 are hybrid-bonded together as the metal vias 222, 226 of the first dies 202, 206 are attached to the metal vias 224 of the second die 204. After the first bonding layer 236 and the second bonding layer 260 are bonded together, first transistors 254 disposed in the first die 202 are facing away from second transistors 256 disposed in the second die 204. The example process 1300 ends.

Figure 14:
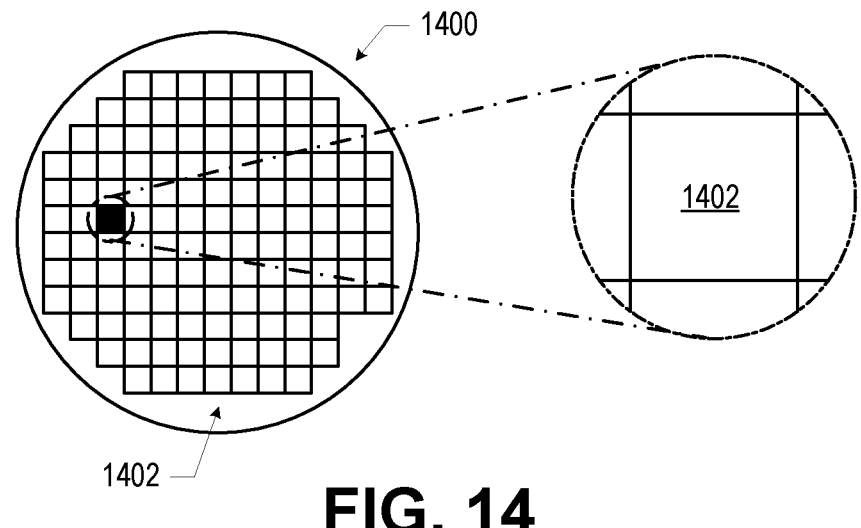
FIG. 14 is a top view of a wafer and dies that may be included in an IC package constructed in accordance with teachings disclosed herein.

FIG. 14 is a top view of a wafer 1400 and dies 1402 that may be included in the IC package 100 of FIG. 1 (e.g., as any suitable ones of the dies) in accordance with teachings disclosed herein. The wafer 1400 may be composed of semiconductor material and may include one or more dies 1402 having IC structures formed on a surface of the wafer 1400. Each of the dies 1402 may be a repeating unit of a semiconductor product that includes any suitable IC. After the fabrication of the semiconductor product is complete, the wafer 1400 may undergo a singulation process in which the dies 1402 are separated from one another to provide discrete "chips" of the semiconductor product. The die 1402 may include one or more transistors (e.g., some of the transistors 1540 of FIG. 15, discussed below), supporting circuitry to route electrical signals to the transistors, passive components (e.g., signal traces, resistors, capacitors, or inductors), and/or as well as any other IC components. In some examples, the wafer 1400 or the die 1402 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1402. For example, a memory array formed by multiple memory devices may be formed on a same die 1402 as a processing device (e.g., the processing device 1600 of FIG. 16) or other logic that is configured to store information in the memory devices or execute instructions stored in the memory array. The example IC package 100 disclosed herein may be manufactured using a die-to-wafer assembly technique in which some dies are attached to a wafer 1400 that include others of the dies, and the wafer 1400 is subsequently singulated.

Figure 15:
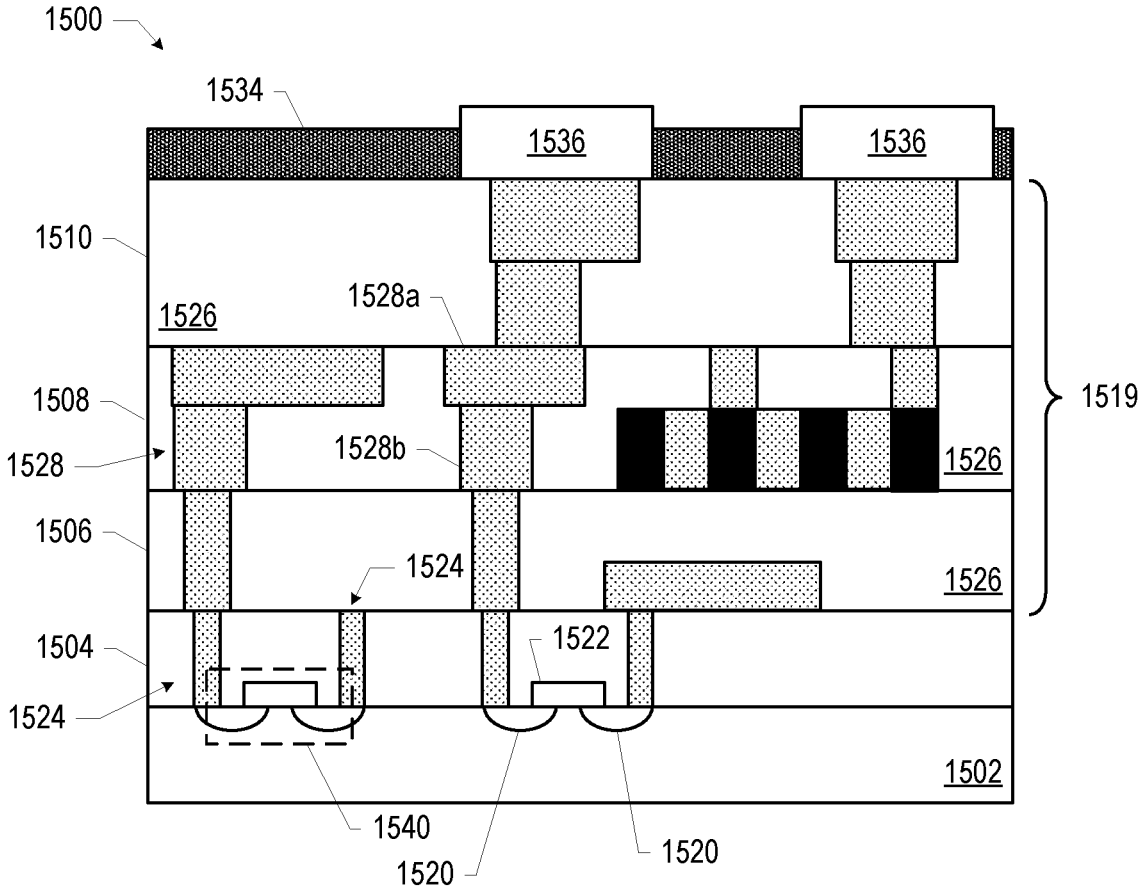
FIG. 15 is a cross-sectional side view of an IC device that may be included in an IC package constructed in accordance with teachings disclosed herein.

FIG. 15 is a cross-sectional side view of an IC device 1500 that may be included in the example IC package 100 (e.g., in any one of the dies) constructed in accordance with teachings disclosed herein. One or more of the IC devices 1500 may be included in one or more dies 1402 (FIG. 14). The IC device 1500 may be formed on a substrate 1502 (e.g., the wafer 1400 of FIG. 14) and may be included in a die (e.g., the die 1402 of FIG. 14). The substrate 1502 may be a semiconductor substrate composed of semiconductor material systems including, for example, n-type or p-type materials systems (or a combination of both). The substrate 1502 may include, for example, a crystalline substrate formed using a bulk silicon or a silicon-on-insulator (SOI) substructure. In some examples, the substrate 1502 may be formed using alternative materials, which may or may not be combined with silicon, which include but are not limited to germanium, indium antimonide, lead telluride, indium arsenide, indium phosphide, gallium arsenide, or gallium antimonide. Further materials classified as group II-VI, III-V, or IV may also be used to form the substrate 1502. Although a few examples of materials from which the substrate 1502 may be formed are described here, any material that may serve as a foundation for an IC device 1500 may be used. The substrate 1502 may be part of a singulated die (e.g., the dies 1402 of FIG. 14) or a wafer (e.g., the wafer 1400 of FIG. 14).

The IC device 1500 may include one or more device layers 1504 disposed on the substrate 1502. The device layer

1504 may include features of one or more transistors 1540 (e.g., metal oxide semiconductor field-effect transistors (MOSFETs)) formed on the substrate 1502. The device layer 1504 may include, for example, one or more source and/or drain (S/D) regions 1520, a gate 1522 to control current flow in the transistors 1540 between the S/D regions 1520, and one or more S/D contacts 1524 to route electrical signals to/from the S/D regions 1520. The transistors 1540 may include additional features not depicted for the sake of clarity, such as device isolation regions, gate contacts, and the like. The transistors 1540 are not limited to the type and configuration depicted in FIG. 15 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1540 may include a gate 1522 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1540 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1540 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1520 may be formed within the substrate 1502 adjacent to the gate 1522 of each transistor 1540. The S/D regions 1520 may be formed using an implantation/diffusion process or an etching/deposition process, for example. In the former process, dopants such as boron, aluminum, antimony, phosphorous, or arsenic may be ion-implanted into the substrate 1502 to form the S/D regions 1520. An annealing process that activates the dopants and causes them to diffuse farther into the substrate 1502 may follow the ion-implantation process. In the latter process, the substrate 1502 may first be etched to form recesses at the locations of the S/D regions 1520. An epitaxial deposition process may then be carried out to fill the recesses with material that is used to fabricate the S/D regions 1520. In some implementations, the S/D regions 1520 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1520 may be formed using one or more alternate semiconductor materials such as germanium or a group III-V material or alloy. In further examples, one or more layers of metal and/or metal alloys may be used to form the S/D regions 1520.

Electrical signals, such as power and/or input/output (I/O) signals, may be routed to and/or from the devices (e.g., transistors 1540) of the device layer 1504 through one or more interconnect layers disposed on the device layer 1504 (illustrated in FIG. 15 as interconnect layers 1506-1510). For example, electrically conductive features of the device layer 1504 (e.g., the gate 1522 and the S/D contacts 1524) may be electrically coupled with the interconnect structures 1528 of the interconnect layers 1506-1510. The one or more interconnect layers 1506-1510 may form a metallization stack (also referred to as an "ILD stack") 1519 of the IC device 1500.

The interconnect structures 1528 may be arranged within the interconnect layers 1506-1510 to route electrical signals according to a wide variety of designs (in particular, the arrangement is not limited to the particular configuration of interconnect structures 1528 depicted in FIG. 15). Although a particular number of interconnect layers 1506-1510 is depicted in FIG. 15, examples of the present disclosure include IC devices having more or fewer interconnect layers than depicted.

In some examples, the interconnect structures 1528 may include lines 1528a and/or vias 1528b filled with an electrically conductive material such as a metal. The lines 1528a may be arranged to route electrical signals in a direction of a plane that is substantially parallel with a surface of the substrate 1502 upon which the device layer 1504 is formed. For example, the lines 1528a may route electrical signals in a direction in and out of the page from the perspective of FIG. 15. The vias 1528b may be arranged to route electrical signals in a direction of a plane that is substantially perpendicular to the surface of the substrate 1502 upon which the device layer 1504 is formed. In some examples, the vias 1528b may electrically couple lines 1528a of different interconnect layers 1506-1510 together.

The interconnect layers 1506-1510 may include a dielectric material 1526 disposed between the interconnect structures 1528, as shown in FIG. 15. In some examples, the dielectric material 1526 disposed between the interconnect structures 1528 in different ones of the interconnect layers 1506-1510 may have different compositions; in other examples, the composition of the dielectric material 1526 between different interconnect layers 1506-1510 may be the same.

A first interconnect layer 1506 (referred to as Metal 1 or "M1") may be formed directly on the device layer 1504. In some examples, the first interconnect layer 1506 may include lines 1528a and/or vias 1528b, as shown. The lines 1528a of the first interconnect layer 1506 may be coupled with contacts (e.g., the S/D contacts 1524) of the device layer 1504.

A second interconnect layer 1508 (referred to as Metal 2 or "M2") may be formed directly on the first interconnect layer 1506. In some examples, the second interconnect layer 1508 may include vias 1528b to couple the lines 1528a of the second interconnect layer 1508 with the lines 1528a of the first interconnect layer 1506. Although the lines 1528a and the vias 1528b are structurally delineated with a line within each interconnect layer (e.g., within the second interconnect layer 1508) for the sake of clarity, the lines 1528a and the vias 1528b may be structurally and/or materially contiguous (e.g., simultaneously filled during a dual-damascene process) in some examples.

A third interconnect layer 1510 (referred to as Metal 3 or "M3") (and additional interconnect layers, as desired) may be formed in succession on the second interconnect layer 1508 according to similar techniques and configurations described in connection with the second interconnect layer 1508 or the first interconnect layer 1506. In some examples, the interconnect layers that are "higher up" in the metallization stack 1519 in the IC device 1500 (i.e., further away from the device layer 1504) may be thicker.

The IC device 1500 may include a solder resist material 1534 (e.g., polyimide or similar material) and one or more conductive contacts 1536 formed on the interconnect layers 1506-1510. In FIG. 15, the conductive contacts 1536 are illustrated as taking the form of bond pads. The conductive contacts 1536 may be electrically coupled with the interconnect structures 1528 and configured to route the electrical signals of the transistor(s) 1540 to other external devices. For example, solder bonds may be formed on the one or more conductive contacts 1536 to mechanically and/or electrically couple a chip including the IC device 1500 with another component (e.g., a circuit board). The IC device 1500 may include additional or alternate structures to route the electrical signals from the interconnect layers 1506-1510; for example, the conductive contacts 1536 may include other analogous features (e.g., posts) that route the electrical signals to external components.

Figure 16:
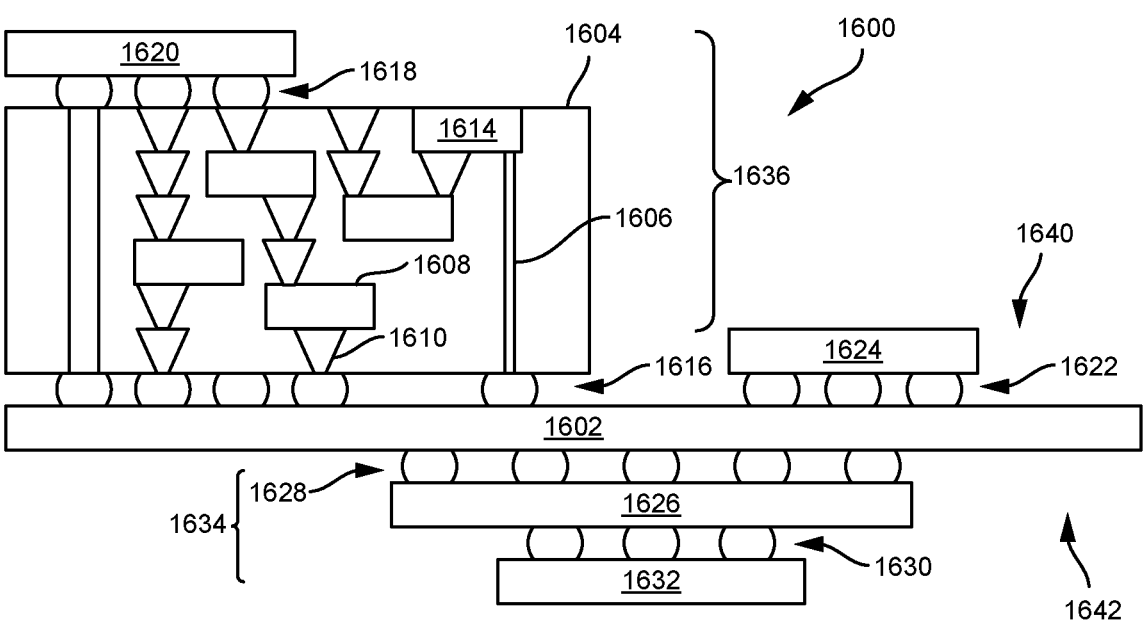
FIG. 16 is a cross-sectional side view of an IC device assembly that may include an IC package constructed in accordance with teachings disclosed herein.

FIG. 16 is a cross-sectional side view of an IC device assembly 1600 that may include the IC package 100 with any one of the example package substrates disclosed herein constructed in accordance with teachings disclosed herein. The IC device assembly 1600 includes a number of components disposed on a circuit board 1602 (which may be, for example, a motherboard). The IC device assembly 1600 includes components disposed on a first face 1640 of the circuit board 1602 and an opposing second face 1642 of the circuit board 1602; generally, components may be disposed on one or both faces 1640 and 1642. Any of the IC packages discussed below with reference to the IC device assembly 1600 may take the form of any of the examples of the IC package 100 of FIG. 1.

In some examples, the circuit board 1602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1602. In other examples, the circuit board 1602 may be a non-PCB substrate. In some examples, the circuit board 1602 may be, for example, the circuit board of FIG. 1.

The IC device assembly 1600 illustrated in FIG. 16 includes a package-on-interposer structure 1636 coupled to the first face 1640 of the circuit board 1602 by coupling components 1616. The coupling components 1616 may electrically and mechanically couple the package-on-interposer structure 1636 to the circuit board 1602, and may include solder balls (as shown in FIG. 16), male and female portions of a socket, an adhesive, an underfill material, and/or any other suitable electrical and/or mechanical coupling structure.

The package-on-interposer structure 1636 may include an IC package 1620 coupled to an interposer 1604 by coupling components 1618. The coupling components 1618 may take any suitable form for the application, such as the forms discussed above with reference to the coupling components 1616. Although a single IC package 1620 is shown in FIG. 16, multiple IC packages may be coupled to the interposer 1604; indeed, additional interposers may be coupled to the interposer 1604. The interposer 1604 may provide an intervening substrate used to bridge the circuit board 1602 and the IC package 1620. The IC package 1620 may be or include, for example, a die (the die 1402 of FIG. 14), an IC device (e.g., the IC device 1500 of FIG. 15), or any other suitable component. Generally, the interposer 1604 may spread a connection to a wider pitch or reroute a connection to a different connection. For example, the interposer 1604 may couple the IC package 1620 (e.g., a die) to a set of BGA conductive contacts of the coupling components 1616 for coupling to the circuit board 1602. In the example illustrated in FIG. 16, the IC package 1620 and the circuit board 1602 are attached to opposing sides of the interposer 1604; in other examples, the IC package 1620 and the circuit board 1602 may be attached to a same side of the interposer 1604. In some examples, three or more components may be interconnected by way of the interposer 1604.

The interposer 1604 may be formed of an epoxy resin, a fiberglass-reinforced epoxy resin, an epoxy resin with inorganic fillers, a ceramic material, or a polymer material such as polyimide. In some examples, the interposer 1604 may be formed of alternate rigid or flexible materials that may include the same materials described above for use in a semiconductor substrate, such as silicon, germanium, and other group III-V and group IV materials. The interposer 1604 may include metal interconnects 1608 and vias 1610, including but not limited to through-silicon vias (TSVs) 1606. The interposer 1604 may further include embedded devices 1614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1604. The package-on-interposer structure 1636 may take the form of any of the package-on-interposer structures known in the art.

The IC device assembly 1600 may include an IC package 1624 coupled to the first face 1640 of the circuit board 1602 by coupling components 1622. The coupling components 1622 may take the form of any of the examples discussed above with reference to the coupling components 1616, and the IC package 1624 may take the form of any of the examples discussed above with reference to the IC package 1620.

The IC device assembly 1600 illustrated in FIG. 16 includes a package-on-package structure 1634 coupled to the second face 1642 of the circuit board 1602 by coupling components 1628. The package-on-package structure 1634 may include a first IC package 1626 and a second IC package 1632 coupled together by coupling components 1630 such that the first IC package 1626 is disposed between the circuit board 1602 and the second IC package 1632. The coupling components 1628, 1630 may take the form of any of the examples of the coupling components 1616 discussed above, and the IC packages 1626, 1632 may take the form of any of the examples of the IC package 1620 discussed above. The package-on-package structure 1634 may be configured in accordance with any of the package-on-package structures known in the art.

Figure 17:
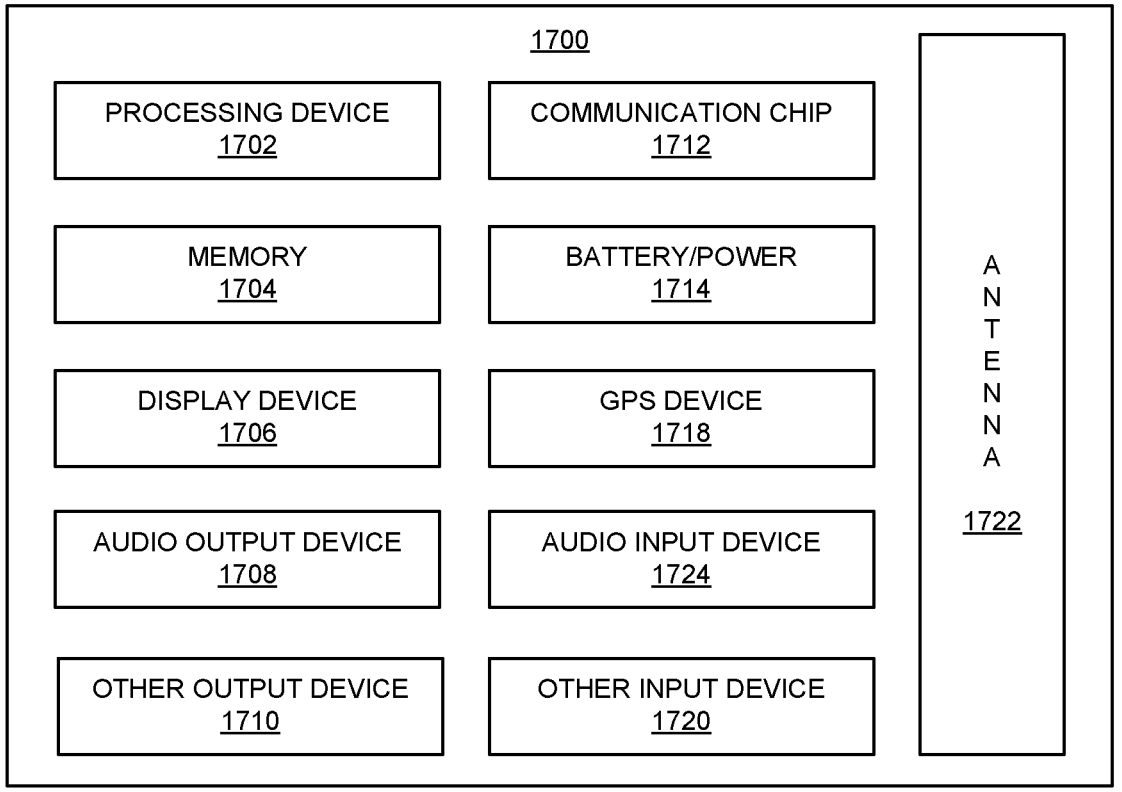
FIG. 17 is a block diagram of an example electrical device that may include an IC package constructed in accordance with teachings disclosed herein.

FIG. 17 is a block diagram of an example electrical device 1700 that may include one or more of the example IC packages 100 of FIG. 1 with any one of the example package substrates disclosed herein constructed in accordance with teachings disclosed herein. For example, any suitable ones of the components of the electrical device 1700 may include one or more of the IC packages 1600, IC devices 1500, or dies 1402 disclosed herein. A number of components are illustrated in FIG. 17 as included in the electrical device 1700, but any one or more of these components may be omitted or duplicated, as suitable for the application. In some examples, some or all of the components included in the electrical device 1700 may be attached to one or more motherboards. In some examples, some or all of these components are fabricated onto a single system-on-a-chip (SoC) die.

Additionally, in various examples, the electrical device 1700 may not include one or more of the components illustrated in FIG. 17, but the electrical device 1700 may include interface circuitry for coupling to the one or more components. For example, the electrical device 1700 may not include a display device 1706, but may include display device interface circuitry (e.g., a connector and driver circuitry) to which a display device 1706 may be coupled. In another set of examples, the electrical device 1700 may not include an audio input device 1724 or an audio output device 1708, but may include audio input or output device interface circuitry (e.g., connectors and supporting circuitry) to which an audio input device 1724 or audio output device 1708 may be coupled.

The electrical device 1700 may include a processing device 1702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1700 may include a memory 1704, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1704 may include memory that shares a die with the processing device 1702. This memory may be used as cache memory and may include embedded dynamic random access memory (eDRAM) or spin transfer torque magnetic random access memory (STT-MRAM).

In some examples, the electrical device 1700 may include a communication chip 1712 (e.g., one or more communication chips). For example, the communication chip 1712 may be configured for managing wireless communications for the transfer of data to and from the electrical device 1700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1712 may operate in accordance with other wireless protocols in other examples. The electrical device 1700 may include an antenna 1722 to facilitate wireless communications and/or to receive other wireless communications (such as AM or FM radio transmissions).

In some examples, the communication chip 1712 may manage wired communications, such as electrical, optical, or any other suitable communication protocols (e.g., the Ethernet). As noted above, the communication chip 1712 may include multiple communication chips. For instance, a first communication chip 1712 may be dedicated to shorter-range wireless communications such as Wi-Fi or Bluetooth, and a second communication chip 1712 may be dedicated to longer-range wireless communications such as global positioning system (GPS), EDGE, GPRS, CDMA, WiMAX, LTE, EV-DO, or others. In some examples, a first communication chip 1712 may be dedicated to wireless communications, and a second communication chip 1712 may be dedicated to wired communications.

The electrical device 1700 may include battery/power circuitry 1714. The battery/power circuitry 1714 may include one or more energy storage devices (e.g., batteries or capacitors) and/or circuitry for coupling components of the electrical device 1700 to an energy source separate from the electrical device 1700 (e.g., AC line power).

The electrical device 1700 may include a display device 1706 (or corresponding interface circuitry, as discussed above). The display device 1706 may include any visual indicators, such as a heads-up display, a computer monitor, a projector, a touchscreen display, a liquid crystal display (LCD), a light-emitting diode display, or a flat panel display.

The electrical device 1700 may include an audio output device 1708 (or corresponding interface circuitry, as discussed above). The audio output device 1708 may include any device that generates an audible indicator, such as speakers, headsets, or earbuds.

The electrical device 1700 may include an audio input device 1724 (or corresponding interface circuitry, as discussed above). The audio input device 1724 may include any device that generates a signal representative of a sound, such as microphones, microphone arrays, or digital instruments (e.g., instruments having a musical instrument digital interface (MIDI) output).

The electrical device 1700 may include a GPS device 1718 (or corresponding interface circuitry, as discussed above). The GPS device 1718 may be in communication with a satellite-based system and may receive a location of the electrical device 1700, as known in the art.

The electrical device 1700 may include any other output device 1710 (or corresponding interface circuitry, as discussed above). Examples of the other output device 1710 may include an audio codec, a video codec, a printer, a wired or wireless transmitter for providing information to other devices, or an additional storage device.

The electrical device 1700 may include any other input device 1720 (or corresponding interface circuitry, as discussed above). Examples of the other input device 1720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1700 may have any desired form factor, such as a hand-held or mobile electrical device (e.g., a cell phone, a smart phone, a mobile internet device, a music player, a tablet computer, a laptop computer, a net-book computer, an ultrabook computer, a personal digital assistant (PDA), an ultra mobile personal computer, etc.), a desktop electrical device, a server or other networked com-puting component, a printer, a scanner, a monitor, a set-top box, an entertainment control unit, a vehicle control unit, a digital camera, a digital video recorder, or a wearable electrical device. In some examples, the electrical device 1700 may be any other electronic device that processes data. "Including" and "comprising" (and all forms and tenses thereof) are used herein to be open ended terms. Thus, whenever a claim employs any form of "include" or "com-prise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of pro-cesses, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that are integrated circuit packages with hybrid bonded dies. Disclosed systems, methods, apparatus, and articles of manufacture improve the efficiency of using a computing device by increasing the surface area by stacking a first die onto a second die. The stacked die is more efficient, and the computing device is to run faster. Disclosed systems, methods, apparatus, and articles of manufacture are accordingly directed to one or more improvement(s) in the operation of a machine such as a computer or other elec-tronic and/or mechanical device.

Example methods, apparatus, systems, and articles of manufacture to enable electrical routing on glass cores in integrated circuit packages are disclosed herein. Further examples and combinations thereof include the following: Example methods, apparatus, systems, and articles of manu-facture to integrated circuit packages with hybrid bonded dies and methods of manufacturing the same are disclosed herein. Further examples and combinations thereof include the following:

Example 1 includes an integrated circuit (IC) package comprising a first die including a first surface and a second surface opposite the first surface, the first surface defined by a first bulk semiconductor region of the first die, a second die including a third surface and a fourth surface opposite the third surface, the third surface defined by a second bulk semiconductor region of the second die, the fourth surface facing towards the second surface, a first bonding layer between the second and fourth surfaces, the first bonding layer including first metal vias disposed therein, and a second bonding layer between the second and fourth sur-faces, the second bonding layer including second metal vias disposed therein, the first bonding layer in direct contact with the second bonding layer, ones of the first metal vias in direct contact with ones of the second metal vias to electri-cally couple the first die to the second die Example 2 includes the IC package of example 1, further including a silicon lid adjacent the first surface of the first die.

Example 3 includes the IC package of example 1, wherein the first die further includes a testing pad region, the testing pad region adjacent to the first bonding layer.

Example 4 includes the IC package of example 1, further including a third die including a fifth surface and a sixth surface opposite the fifth surface, the fifth surface defined by a third bulk semiconductor region of the third die, the third die adjacent to the first die in a direction parallel to the fourth surface.

Example 5 includes the IC package of example 4, further including a dielectric fill between the first die and the third die.

Example 6 includes the IC package of example 5, wherein the dielectric fill includes a bread-loafing line, the bread-loafing line closer to a lateral side of the first die adjacent the second surface than the bread-loafing line is to the lateral side of the first die adjacent the first surface.

Example 7 includes the IC package of example 5, further including an adhesion layer between the dielectric fill and the first die and the third die, the dielectric fill and the adhesion layer ending at the first bonding layer.

Example 8 includes the IC package of example 1, wherein at least one of the first metal vias is electrically isolated from metal interconnects within the first die.

Example 9 includes the IC package of example 7, wherein the first die includes first transistors and the second die include second transistors, the first transistors distal from the second transistors, whereas the metal interconnects within the first die and metal interconnects within the second die are adjacent.

Example 10 includes the IC package of example 1, wherein the first bulk semiconductor region of the first die is distal from the second bulk semiconductor region of the second die.

Example 11 includes the IC package of example 1, further including a via layer in between the first bonding layer and the second surface of the first die.

Example 12 includes the IC package of example 1, wherein there is not a via layer between the first bonding layer and the second surface of the first die.

Example 13 includes the IC package of example 1, further including a fusion bonding dielectric, the fusion bonding dielectric layer to align the first dies to a first carrier wafer, wherein a first plurality of the first dies includes a first misalignment and a second plurality of the first dies includes a second misalignment, the first misalignment different than the second misalignment.

Example 14 includes a method of manufacturing integrated circuit (IC) packages, the method comprising positioning first dies onto a first carrier wafer with metal contacts of the first dies adjacent to the first carrier wafer, attaching a lid to the first dies, the first dies between the first carrier wafer and the lid, removing the first carrier wafer from the first dies to expose surfaces of the first dies, the exposed surfaces of the first dies to include exposed portions of the metal contacts, depositing a first bonding layer over the exposed surfaces of the first dies, adding first metal vias into the bonding layer, ones of the first metal vias to electrically contact ones of the exposed portions of the metal contacts, providing second dies on a second wafer, the second dies covered by a second bonding layer with second metal vias extending through the second bonding layer, attaching, via fusion bonding, the first metal vias to the second metal vias, and attaching, via fusion bonding, the first bonding layer to the second bonding layer.

Example 15 includes the method of example 14, wherein the second wafer is a reconstituted carrier wafer.

Example 16 includes the method of example 14, further including removing the second wafer from the second dies.

Example 17 includes the method of example 14, wherein the second wafer is a non-reconstituted carrier wafer.

Example 18 includes the method of example 14, further including depositing a dielectric fill.

Example 19 includes the method of example 14, wherein the lid includes silicon.

Example 20 includes the method of example 14, further including fabricating a plurality of dies on a semiconductor wafer, the semiconductor wafer distinct and separate from the first carrier wafer, the plurality of dies including the first dies.

Example 21 includes an apparatus comprising first dies including metal contacts, the metal contacts adjacent to a first bonding layer, the first bonding layer adjacent to a second bonding layer, the second bonding layer associated with second dies including second metal contacts, the second metal contacts adjacent to the second bonding layer.

Example 22 includes the apparatus of example 21, the apparatus further including ones of the first dies stacked vertically adjacent to ones of the second dies.

Example 23 includes the apparatus of example 21, the apparatus further to include vias that extend through the first bonding layer and the second bonding layer.

Example 24 includes the apparatus of example 21, the apparatus to include third dies, wherein a first one of the third dies is next to a first one of the first dies, and an oxide layer adjacent to the first one of the third dies and the first one of the first dies.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package comprising:
a first die including a first surface and a second surface opposite the first surface, the first surface defined by a first bulk semiconductor region of the first die;
a second die including a third surface and a fourth surface opposite the third surface, the third surface defined by a second bulk semiconductor region of the second die, the fourth surface facing towards the second surface;
a third die including a fifth surface and a sixth surface opposite the fifth surface, the fifth surface defined by a third bulk semiconductor region of the third die, the third die adjacent to the first die in a direction parallel to the fourth surface;
a first bonding layer between the second and fourth surfaces, the first bonding layer including first metal vias therein; and
a second bonding layer between the second and fourth surfaces, the second bonding layer including second metal vias therein, the first bonding layer in direct contact with the second bonding layer, ones of the first metal vias in direct contact with ones of the second metal vias to electrically couple the first die to the second die.

2. The IC package of claim 1, including a silicon lid adjacent the first surface of the first die.

3. The IC package of claim 1, wherein the first die includes a testing pad region, the testing pad region adjacent to the first bonding layer.

4. The IC package of claim 1, including a dielectric fill between the first die and the third die.

5. The IC package of claim 4, wherein the dielectric fill includes a bread-loafing line, the bread-loafing line closer to a lateral side of the first die adjacent the second surface than the bread-loafing line is to the lateral side of the first die adjacent the first surface.

6. The IC package of claim 4, including an adhesion layer between the dielectric fill and the first die and between the dielectric fill and the third die, the dielectric fill and the adhesion layer ending at the first bonding layer.

7. The IC package of claim 1, wherein at least one of the first metal vias is electrically isolated from metal interconnects within the first die.

8. The IC package of claim 7, wherein the first die includes first transistors and the second die includes second transistors, the first transistors are distal from the second transistors, the metal interconnects within the first die are adjacent to metal interconnects within the second die.

9. The IC package of claim 1, wherein the first bulk semiconductor region of the first die is distal from the second bulk semiconductor region of the second die.

10. The IC package of claim 1, including a via layer in-between the first bonding layer and the second surface of the first die.

11. The IC package of claim 1, wherein there is not a via layer between the first bonding layer and the second surface of the first die.

12. The IC package of claim 1, including a fusion bonding dielectric layer, the fusion bonding dielectric layer to align the first dies to a first carrier wafer, a first plurality of the first dies includes a first misalignment and a second plurality of the first dies includes a second misalignment, the first misalignment different than the second misalignment.

13. A method of manufacturing the IC package of claim 1, the method comprising:

positioning the first die onto a first carrier wafer with metal contacts of the first die adjacent to the first carrier wafer;

attaching a lid to the first die, the first die between the first carrier wafer and the lid;

removing the first carrier wafer from the first die to expose surfaces of the first die, the exposed surfaces of the first dies to include exposed portions of the metal contacts;

depositing the first bonding layer over the exposed surfaces of the first die;

adding the first metal vias into the first bonding layer, ones of the first metal vias to electrically contact ones of the exposed portions of the metal contacts;

providing the second die on a second wafer, the second die covered by the second bonding layer with the second metal vias extending through the second bonding layer;

attaching, via fusion bonding, the first metal vias to the second metal vias; and attaching, via fusion bonding, the first bonding layer to the second bonding layer.

14. The method of claim 13, wherein the second wafer is a reconstituted carrier wafer.

15. The method of claim 13, including removing the second wafer from the second die.

16. The method of claim 13, wherein the second wafer is a non-reconstituted carrier wafer.

17. The method of claim 13, including depositing a dielectric fill.

18. The method of claim 13, wherein the lid includes silicon.

19. The method of claim 13, including fabricating a plurality of dies on a semiconductor wafer, the semiconductor wafer distinct and separate from the first carrier wafer, the plurality of dies including the first die.

* * * * *